US012563892B2

(12) United States Patent
Park et al.

(10) Patent No.: US 12,563,892 B2
(45) Date of Patent: Feb. 24, 2026

(54) DISPLAY MODULE AND DISPLAY DEVICE

(71) Applicant: LG Display Co., Ltd., Seoul (KR)

(72) Inventors: Chanhyeok Park, Paju-si (KR);
Chikyung Sung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 678 days.

(21) Appl. No.: 17/529,996

(22) Filed: Nov. 18, 2021

(65) Prior Publication Data

US 2022/0209167 A1      Jun. 30, 2022

(30) Foreign Application Priority Data

Dec. 24, 2020    (KR) ........................ 10-2020-0183758

(51) Int. Cl.
| | |
|---|---|
| *B32B 5/18* | (2006.01) |
| *B32B 15/04* | (2006.01) |
| *H10K 50/87* | (2023.01) |
| *H10K 59/80* | (2023.01) |
| *B32B 7/12* | (2006.01) |
| *H10K 102/00* | (2023.01) |

(52) U.S. Cl.
CPC .............. *H10K 50/87* (2023.02); *B32B 5/18* (2013.01); *B32B 15/046* (2013.01); *H10K 59/87* (2023.02); *H10K 59/8794* (2023.02); *B32B 7/12* (2013.01); *B32B 2255/062* (2013.01); *B32B 2266/045* (2013.01); *B32B 2307/7376* (2023.05); *B32B 2457/20* (2013.01); *H10K 2102/311* (2023.02)

(58) Field of Classification Search
CPC ... B32B 5/18; B32B 15/046; B32B 2255/062; B32B 2457/20; H10K 2102/311
See application file for complete search history.

(56) References Cited

U.S. PATENT DOCUMENTS

| | | | | |
|---|---|---|---|---|
| 3,969,572 | A | * | 7/1976 | Rostek ................ H05K 9/0015 |
| | | | | 277/921 |
| 9,274,360 | B2 | | 3/2016 | Oh et al. |
| 9,363,342 | B2 | | 6/2016 | Shin et al. |
| 9,541,961 | B1 | | 1/2017 | Buxton et al. |
| 9,616,625 | B2 | | 4/2017 | Allore et al. |
| 9,698,362 | B2 | | 7/2017 | Kim |
| 10,076,890 | B2 | | 9/2018 | Oh et al. |

(Continued)

FOREIGN PATENT DOCUMENTS

| | | |
|---|---|---|
| CN | 103137022 A | 6/2013 |
| CN | 104241513 A | 12/2014 |

(Continued)

*Primary Examiner* — Joanna Pleszczynska
(74) *Attorney, Agent, or Firm* — Seed Intellectual Property Law Group LLP

(57) ABSTRACT

A display module and a display device which can improve a heat-dissipation performance and a shock absorption function while reducing a bezel area include a cushion plate with a metal foam that has both a heat-dissipation function and a cushion function, so that both of an effective heat-dissipation function and an effective cushion function can be realized only using the metal foam without addition of a separate heat-dissipation layer or cushion layer. Further, the metal foam of the cushion plate has very excellent heat-dissipation function and cushioning function at only a small thickness thereof, so that a total thickness of the cushion plate can be greatly reduced, and the bezel area can be reduced.

14 Claims, 15 Drawing Sheets

(56) References Cited

U.S. PATENT DOCUMENTS

| | | | |
|---|---|---|---|
| 10,321,590 | B2 | 6/2019 | Cater et al. |
| 10,462,896 | B1 | 10/2019 | Kwon et al. |
| 10,691,163 | B2 | 6/2020 | Kim et al. |
| 10,915,151 | B2 | 2/2021 | Silvanto et al. |
| 11,087,110 | B2 | 8/2021 | Park et al. |
| 2006/0152905 | A1 | 7/2006 | Kim et al. |
| 2009/0135096 | A1 | 5/2009 | Jeong |
| 2010/0230155 | A1 | 9/2010 | Hashizume et al. |
| 2011/0261517 | A1 | 10/2011 | Fuke |
| 2012/0175165 | A1 | 7/2012 | Merz et al. |
| 2012/0319140 | A1 | 12/2012 | Hsu |
| 2013/0027892 | A1 | 1/2013 | Lim et al. |
| 2013/0169575 | A1 | 7/2013 | Masuda et al. |
| 2013/0222298 | A1 | 8/2013 | Kato et al. |
| 2014/0078719 | A1 | 3/2014 | Jung et al. |
| 2014/0240911 | A1 | 8/2014 | Cole et al. |
| 2014/0307396 | A1* | 10/2014 | Lee ................... G02F 1/133305 |
| | | | 29/830 |
| 2015/0003011 | A1 | 1/2015 | Peters et al. |
| 2015/0192951 | A1 | 7/2015 | Chong et al. |
| 2016/0093644 | A1* | 3/2016 | Ki ...................... H01L 29/7869 |
| | | | 257/43 |
| 2017/0036914 | A1* | 2/2017 | Sohn ..................... C01B 32/176 |
| 2017/0068289 | A1 | 3/2017 | Buxton et al. |
| 2019/0101960 | A1 | 4/2019 | Silvanto et al. |
| 2019/0174658 | A1 | 6/2019 | Qi et al. |
| 2019/0207130 | A1* | 7/2019 | He ......................... H10K 71/80 |
| 2019/0278411 | A1 | 9/2019 | Jeon et al. |
| 2019/0357366 | A1* | 11/2019 | Choi ................... H04M 1/0268 |
| 2019/0393433 | A1* | 12/2019 | Dagn ................... H10K 50/844 |
| 2020/0057472 | A1 | 2/2020 | Kang et al. |
| 2020/0154605 | A1 | 5/2020 | Bozorgi |
| 2020/0169623 | A1 | 5/2020 | Shin |
| 2020/0194516 | A1 | 6/2020 | Kim et al. |
| 2020/0194710 | A1 | 6/2020 | Zhao et al. |
| 2020/0227504 | A1 | 7/2020 | Luo et al. |
| 2020/0249723 | A1 | 8/2020 | Mizoguchi et al. |
| 2020/0303276 | A1* | 9/2020 | Hwang ................ H05K 1/0209 |
| 2020/0325952 | A1 | 10/2020 | Ryu et al. |
| 2020/0393872 | A1 | 12/2020 | Lim et al. |
| 2021/0097253 | A1 | 4/2021 | Kim et al. |
| 2021/0168231 | A1 | 6/2021 | Baker et al. |
| 2021/0291497 | A1 | 9/2021 | Shin et al. |
| 2021/0319724 | A1 | 10/2021 | Jang |
| 2021/0336161 | A1 | 10/2021 | Xiang |
| 2021/0342567 | A1 | 11/2021 | Park et al. |
| 2021/0356996 | A1 | 11/2021 | Zhu |
| 2021/0378155 | A1 | 12/2021 | Qin |
| 2022/0019114 | A1 | 1/2022 | Friedman et al. |
| 2022/0154467 | A1 | 5/2022 | Mort et al. |
| 2022/0201879 | A1 | 6/2022 | Kwak et al. |
| 2023/0127432 | A1 | 4/2023 | Huang et al. |

FOREIGN PATENT DOCUMENTS

| | | | |
|---|---|---|---|
| CN | 104837316 | A | 8/2015 |
| CN | 105655371 | A | 6/2016 |
| CN | 106098564 | A | 11/2016 |
| CN | 108646462 | A | 10/2018 |
| CN | 109147592 | A | 1/2019 |
| CN | 109860240 | A | 6/2019 |
| CN | 209170514 | U | 7/2019 |
| CN | 110896654 | A | 3/2020 |
| CN | 111128011 | A | 5/2020 |
| CN | 111211146 | A | 5/2020 |
| CN | 111324182 | A | 6/2020 |
| KR | 10-2006-0055107 | A | 5/2006 |
| KR | 10-1614139 | B1 | 2/2016 |
| KR | 10-2018-0079044 | A | 7/2018 |
| KR | 10-2113483 | B1 | 11/2018 |
| KR | 10-2019-0011865 | A | 2/2019 |
| KR | 10-2019-0105682 | A | 9/2019 |
| KR | 10-2020-0002456 | A | 1/2020 |
| KR | 20200101559 | A | 8/2020 |
| KR | 10-2020-0129646 | A | 11/2020 |

* cited by examiner

DISPLAY MODULE AND DISPLAY DEVICE

CROSS-REFERENCE TO RELATED APPLICATION

This application claims priority to Korean Patent Application No. 10-2020-0183758 filed on Dec. 24, 2020, in the Korean Intellectual Property Office, the entire disclosure of which is incorporated herein by reference.

BACKGROUND

Technical Field

The present disclosure relates to a display module and a display device, and more specifically, a display module and a display device capable of improving heat-dissipation performance and shock absorption function while reducing a bezel area.

Description of the Related Art

A display device is implemented in a wide variety of forms as in televisions, monitors, smart phones, tablet PCs, notebook computers, and wearable devices.

In general, the display device includes a display area displaying a screen and a non-display area along an outer periphery of the display area.

The display device includes various additional parts such as a driving integrated circuit or a circuit board in addition to a display panel to display the screen.

In the non-display area, the additional parts can be disposed, or various connection parts such as a flexible circuit board for connecting the additional parts to each other can be disposed.

In the display device, the non-display area is also referred to a bezel area. When the bezel area is wide, a user's gaze can be distracted. However, when the bezel area is narrow, the user's gaze can focus on the screen of the display area such that user immersion increases.

In other words, when the bezel area becomes narrower, an entire size of the display device can be reduced while increasing the user immersion. Accordingly, demand from the user for the display device that can reduce the bezel area as much as possible is increasing.

BRIEF SUMMARY

In the display device, not only a pad of the display panel but also various additional parts such as the driving integrated circuit and the circuit board can be disposed on a lower surface of the display panel in order to secure the display area as large as possible and to ensure the minimum bezel area.

In this case, the various additional components can be mounted on or connected to a connection component such as a flexible circuit board and can be disposed on the lower surface of the display panel.

For example, the flexible circuit board connected to one distal end of the display panel can be bent in a direction from the bezel area to the lower surface of the display panel.

Alternatively, as one distal end of the display panel is bent toward the lower surface of the display panel, the various additional parts can be disposed on the lower surface of the display panel.

In this case, when a bending radius of curvature increases, the flexible circuit board or display panel can be bent more stably and easily. However, as the bending radius of curvature increases, the bezel area increases, and a total width of the display device increases.

A cushion plate for heat-dissipation and shock absorption can be disposed on the lower surface of the display panel.

In related art, the cushion plate has a laminated structure in which a plurality of layers having various functions such as a heat-dissipation layer having a heat-dissipation function, a cushion layer capable of absorbing shock, an adhesive layer for bonding the heat-dissipation layer and the cushion layer to each other, etc., are laminated one on top of another.

In this case, when a thickness of each of the heat-dissipation layer and the cushion layer is increased, the heat-dissipation function and shock absorption function can increase. However, as the thickness thereof increases, a total thickness of the display device increases, resulting in an increase in the bezel area.

Otherwise, when the thickness of each of the heat-dissipation layer and the cushion layer is thin to reduce the total thickness of the display device, the heat-dissipation function and the shock absorbing function can be deteriorated.

Further, the heat-dissipation layer and cushion layer having different functions can be formed of different materials suitable for the functions thereof. In this connection, interlayer separation or adhesion deterioration between the various layers formed of different materials can occur.

In particular, in order to fix each layer, a separate adhesive layer must be added between the layers. This can lead to an increase in a thickness, and a limitation in selection of a type of the adhesive layer depending on a material to be bonded and an increase in a cost of the device.

Further, because the cushion plate is formed in a multi-layered structure, change in a shape of the cushion plate can be limited.

Accordingly, the inventors of the present disclosure have invented a display module and a display device which can improve a heat-dissipation performance and a shock absorption function while reducing the bezel area.

A purpose to be achieved according to an embodiment of the present disclosure is to provide a display module and a display device capable of improving a heat-dissipation performance and a shock absorption function while reducing the bezel area.

A purpose to be achieved according to an embodiment of the present disclosure is to provide a display module and a display device capable of improving an electromagnetic interference (EMI) shielding function while reducing the bezel area.

A purpose to be achieved according to an embodiment of the present disclosure is to provide a display module and a display device capable of minimizing interlayer separation or adhesion deterioration between layers constituting a cushion plate.

A purpose to be achieved according to an embodiment of the present disclosure is to provide a display module and a display device including a cushion plate have a higher freedom in a shape change thereof.

Purposes to be achieved according to an embodiment of the present disclosure are not limited to the purpose as mentioned above. Other purposes that are not mentioned can be clearly understood by those skilled in the art based on following descriptions.

A display module according to a first embodiment of the present disclosure includes a display panel including a front portion, a bent portion, and a pad portion extending from the bent portion and disposed under the front portion, a cushion plate disposed between the front portion and the pad, and a connection member configured to connect the pad portion to the cushion plate.

In this case, the cushion plate includes an embossed layer and a metal foam, wherein the metal foam is disposed on a lower surface of the embossed layer. Alternatively, the metal foam is disposed under the embossed layer.

The metal foam has a porous metal structure having a large number of pores therein.

In a second embodiment, a metal foil is disposed on a lower surface of the metal foam.

In a third embodiment, a metal foil is additionally disposed on a side surface of the metal foam of the second embodiment.

In a fourth embodiment, a metal foil is additionally disposed on an upper surface of the metal foam of the third embodiment, so that the metal foam is sealed with the metal foil.

In a fifth embodiment, the metal foam includes a first metal foam layer, a second metal foam layer, and a metal foil disposed between the first metal foam layer and the second metal foam layer.

In a sixth embodiment, a metal foil is additionally disposed on each of lower and side surfaces of the metal foam according to the fifth embodiment, so that the second metal foam layer is sealed with the metal foil.

In a seventh embodiment, a metal foil is additionally disposed on each of a upper surface and a lower surface of the metal foam according to the fifth embodiment.

In an eighth embodiment, a metal foil is additionally disposed on a side surface of the metal foam according to the seventh embodiment, so that the first metal foam layer and the second metal foam layer are sealed with the metal foil.

In a ninth embodiment, a metal paste is applied to a lower surface of the metal foam.

In a tenth embodiment, a heat-dissipation ink is applied to each of lower and side surfaces of the metal foam.

A thickness of the metal foam is in a range of 20 μm to 200 μm, and a thickness of the cushion plate is in a range of 80 μm to 260 μm.

A display device according to an embodiment of the present disclosure includes a cover member, a display module according to an embodiment of the present disclosure coupled to a lower surface of the cover member, and a frame disposed on a lower surface of the display module to support the cover member.

Further, the cushion plate according to the present disclosure includes the metal foam having both a heat-dissipation function and a cushion function. Thus, the cushion plate can have an effective heat-dissipation function and an effective cushion function at the same time only using the metal foam without a separate heat-dissipation layer or a separate cushion layer.

In particular, the metal foam has a very good heat-dissipation function and a very good cushioning function even when the metal foam is thin. Thus, a total thickness of the cushion plate can be greatly reduced, such that the bezel area can be reduced.

Further, in accordance with various embodiments of the present disclosure, a thermal conductivity of the metal foam and the EMI shielding performance can be improved while reducing the bezel area.

Further, the cushion plate according to the present disclosure can realize both the heat-dissipation function and the cushion function only using the metal foam. Thus, it is not necessary to stack separate layers formed of different materials having a heat-dissipation function and a cushion function, respectively, thereby minimizing the interlayer separation or adhesion deterioration.

In addition, because there is no need to add a separate adhesive layer for fixing each of layers, an increase in thickness due to the adhesive layer or an increase in a manufacturing cost of the device due to the addition of various layers may not occur.

Further, because the cushion plate according to the present disclosure includes the metal foam having a higher freedom in the change shape, the shape of the cushion plate can be freely and easily changed in response to a design change of the display module.

Effects of the present disclosure are not limited to the above-mentioned effects, and other effects as not mentioned will be clearly understood by those skilled in the art from following descriptions.

DETAILED DESCRIPTIONS

Figure 1A:
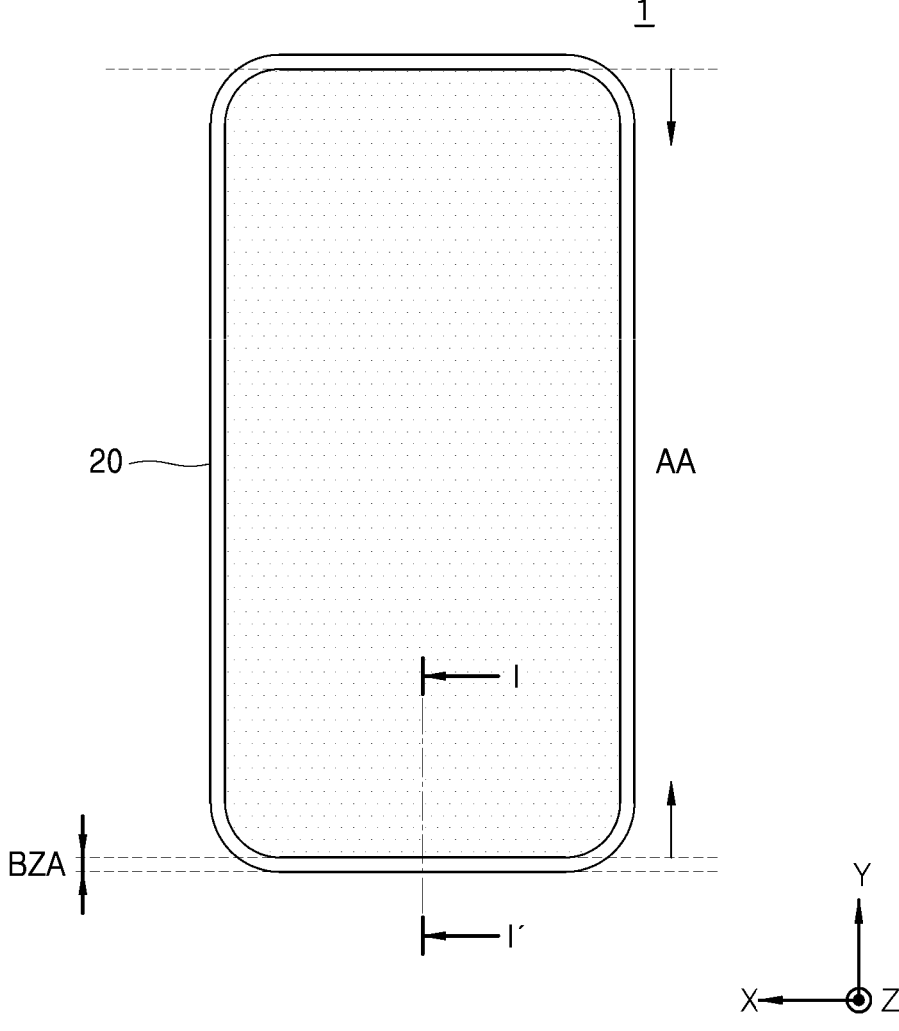
FIGS. 1A and 1B respectively show a upper surface and a lower surface of a display device according to an embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs.

A shape, a size, a ratio, an angle, a number, etc., disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to," or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

In descriptions of temporal relationships, for example, temporal precedent relationships between two events such as "after," "subsequent to," "before," etc., another event can occur therebetween unless "directly after, "directly subsequent" or "directly before" is indicated.

It will be understood that, although the terms "first," "second," "third," and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Hereinafter, various configurations of a display module and a display device that can improve a heat-dissipation performance and a shock absorption function while reducing a bezel area will be described in detail.

Figure 1B:
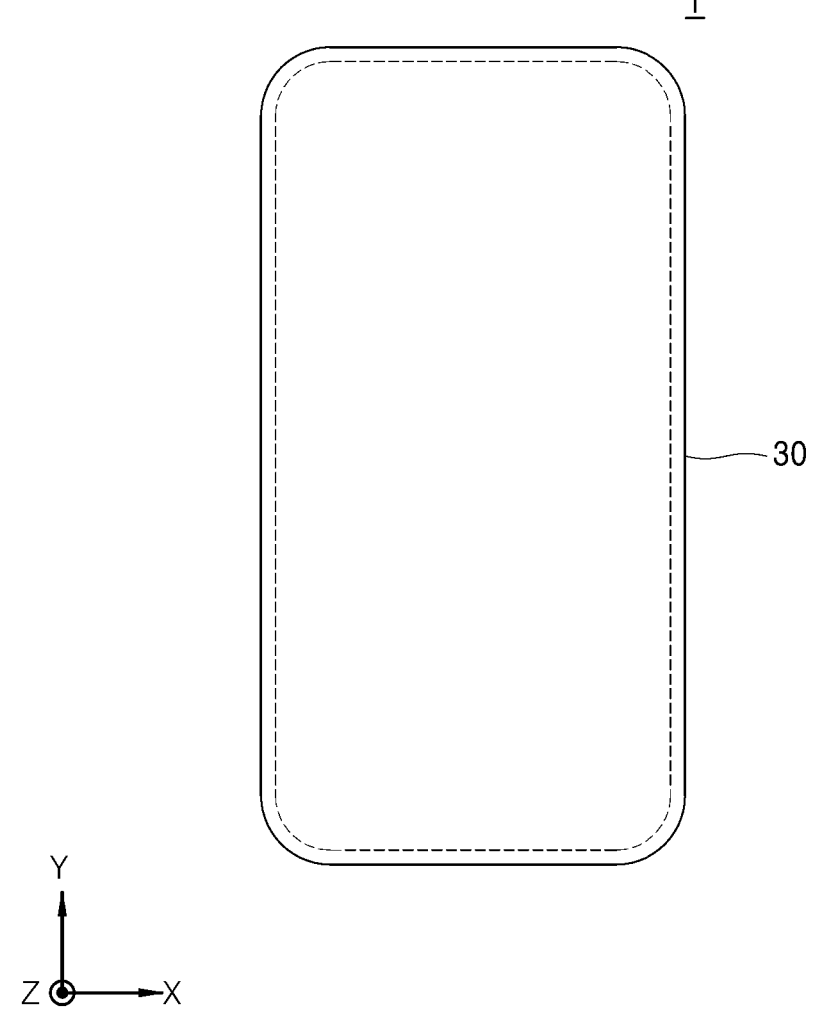

FIG. 1A briefly shows a upper surface of a display device 1 on which a display area AA is disposed, and FIG. 1B briefly shows a lower surface of display device 1.

Herein, a direction toward a upper surface and a top refers to a Z-axis direction, while a direction toward a lower surface and a bottom refers to a −Z-axis direction.

The display device 1 includes a cover member 20, a display module 10 coupled to a lower surface of cover member 20, and a frame 30 in which the display module 10 is disposed. Alternatively, the frame 30 can be disposed under the display module 10. The frame 30 can be coupled to the cover member 20.

The cover member 20 can be disposed to cover a upper surface of the display module 10, and thus can protect the display module 10 from external shocks.

An edge of the cover member 20 can have a round shape in which the edge thereof is curved toward a lower surface thereof on which the display module 10 is disposed.

In this case, the cover member 20 can cover at least a partial area of a side surface of display module 10 disposed on the lower surface thereof, thus protecting not only a upper surface of the display module 10, but also the side face thereof from an external shock.

The cover member 20 includes the display area AA that displays a screen, and thus can be formed of a transparent material such as a cover glass to display the screen. For example, the cover member 20 can be formed of a transparent plastic material, a glass material, or a reinforced glass material.

The frame 30 can be configured to accommodate the display module 10.

The frame 30 can be contacted the cover member 20 to support the cover member 20.

The frame 30 serves as a housing that defines a lower surface of an outermost portion of the display device 1, and can be formed of various materials such as plastic, metal, or glass.

In this case, the frame 30 can function as a casing defining an outermost portion of display device 1. However, the present disclosure is not limited thereto.

For example, the frame 30 can function as a middle frame that serves as a housing that forms the lower surface of display module 10, and there can be an additional casing on the lower surface of the frame 30.

Further, the upper surface of the cover member 20 can be divided into the display area AA and the non-display area NAA as an area other than the display area AA. The non-display area NAA can be formed along an edge of the display area AA, and the non-display area NAA can be defined as a bezel area BZA.

The display module 10 coupled to the lower surface of the cover member 20 can have a bent portion BNP. The bent portion BNP can be disposed in the bezel area BZA blow the cover member 20 in a −Y-axis direction.

In order to reduce the bezel area BZA under the cover member 20, it is desirable to reduce a radius of curvature of the bent portion BNP.

The radius of curvature of the bent portion BNP is proportional to a total thickness of the display module 10 and the display device 1. Thus, as the total thickness increases, the radius of curvature of the bent portion BNP increases. When the total thickness decreases, the radius of curvature of the bent portion BNP decreases.

Therefore, in order not to increase the size of the bezel area BZA, it is desirable to prevent the total thickness of display module 10 and the display device 1 from increasing.

Hereinafter, the display module 10 according to an embodiment of the present disclosure will be described in detail with reference to FIG. 2.

The display module 10 is coupled to the lower surface of the cover member 20.

The display module 10 includes a display panel 100 including a front portion FP, a bent portion BNP, and a pad portion PAD extending from the bent portion BNP and disposed below a lower surface of the front portion FP, a cushion plate 300 disposed between the front portion FP and the pad portion PAD, and a first connection member (or a bent panel fixing member) 400 that fixes or connects the pad portion PAD to the cushion plate 300.

Specifically, under the front portion FP of the display panel 100, a first backplate (or a first plate) 210, the cushion plate 300, the first connection member 400, a second backplate (or a second plate) 220, and the pad portion PAD can be sequentially stacked in this order.

First, the display module 10, specifically a second connection member (or a module fixing member) 150 that fixes or connects the display panel 100 to the cover member 20 is disposed on the lower surface of the cover member 20.

Since the second connection member 150 can be disposed to overlap the display area AA, the second connection member 150 can be embodied as a transparent adhesive member. For example, the second connection member 150 can be formed of or include a material such as OCA (Optical Clear Adhesive), OCR (Optical Clear Resin), or PSA (Pressure Sensitive Adhesive).

A functional film 140 can be additionally disposed between the second connection member 150 and the display panel 100. The functional film 140 can have a structure in which one or more functional layers are stacked one on top of another, but is not particularly limited.

In one example, the functional film 140 can include an antireflection layer such as a polarizing film that prevents reflection of external light to improve an outdoor visibility and a contrast ratio for an image displayed on the display panel 100.

In addition, in one example, the functional film 140 can further include a barrier layer for preventing moisture or oxygen invasion. The barrier layer can be formed of a material having low moisture permeability, such as a polymer material.

The display panel 100 can include a display substrate 110, a pixel array 120 disposed on the display substrate 110, and an encapsulation portion 130 disposed to cover the pixel array 120.

The display substrate 110 can serve as a base substrate of the display panel 100. The display substrate 110 can be formed of a flexible plastic material and thus can act as a flexible display substrate.

In one example, the display substrate can be made of polyimide as a plastic material having flexibility, or can be formed of a thin-type glass material having flexibility.

The pixel array 120 can correspond to an area configured to display the image toward the upper surface of the cover member 20, and thus can correspond to the display area AA.

Therefore, the area corresponding to the pixel array 120 in the cover member 20 can be the display area AA, and the area other than the display area AA can be the bezel area BZA.

The pixel array 120 can be implemented using various elements that display an image, and may not be particularly limited.

The pixel array 120 can include a plurality of pixels that are arranged in a pixel area defined by signal lines on the display substrate 110, and display an image according to signals supplied to the signal lines. The signal lines can include a gate line, a data line, and a pixel driving power line.

Each of the plurality of pixels can include a driving thin film transistor in the pixel area, an anode electrically connected to the driving thin film transistor, a light-emissive element layer formed on the anode, and a cathode electrically connected to the light-emissive element layer.

The driving thin film transistor can include a gate electrode, a semiconductor layer, a source electrode, a drain electrode, and the like. The semiconductor layer of the thin film transistor can include silicon such as a-Si, poly-Si, or low-temperature poly-Si, or an oxide such as IGZO (Indium-Gallium-Zinc-Oxide).

The anode can be disposed in each pixel in a corresponding manner to an opening area defined according to a pattern shape of a pixel, and can be electrically connected to the driving thin film transistor.

In one example, the light-emissive element layer can include an organic light-emissive element formed on the anode. The organic light-emissive element can be implemented to emit light of the same color such as white light across the pixels or can be implemented to emit light of different colors such as red, green, and blue light across the pixels.

In another example, the light-emissive element layer can include a micro light-emissive diode element electrically connected to each of the anode and the cathode. The micro light-emissive diode element refers to a light-emissive diode implemented in a form of an integrated circuit (IC) or a chip, and can include a first terminal electrically connected to the anode and a second terminal electrically connected to the cathode.

The cathode can be commonly connected to a light-emissive element of a light-emissive element layer disposed in each pixel area.

The encapsulation portion 130 is formed on the display substrate 110 to cover the pixel array 120, such that oxygen, moisture, or foreign substances can be prevented from invading into the light-emissive element layer of the pixel array 120. In one example, the encapsulation portion 130 can be formed in a multilayer structure in which organic material layers and inorganic material layers are alternately stacked one on top of another.

The display panel 100 can be divided into the front portion FP, the bent portion BNP, and the pad portion PAD.

The front portion FP of the display panel 100 constitutes a screen on which an image is displayed. The pad portion PAD extends from the bent portion BNP toward a bottom of the front portion FP, and thus is disposed under the front portion FP.

Specifically, when the display panel 100 is bent, the pixel array 120 and the encapsulation portion 130 constitute the front portion FP and thus are not bent, and a partial area of the display substrate 110 corresponding to the pad portion PAD is bent from the bent portion BNP toward the lower surface of the front portion FP.

The first backplate 210 can be disposed under the front portion FP of the display panel 100.

The first backplate 210 is disposed under the display substrate 110 to supplement rigidity of the display substrate 110, while maintaining a portion of the display substrate 110 constituting the front portion FP in a flat state.

Since the first backplate 210 is formed to have a certain strength and a certain thickness to supplement the rigidity of the display substrate 110, the first backplate 120 may not be formed in a portion of the display panel 100 constituting the bent portion BNP.

In one example, the second backplate 220 is disposed on a upper surface of the pad portion PAD of the display panel 100 which extends from the bent portion BNP of the display panel 100 and is disposed below the lower surface of the front portion FP.

Before the display panel 100 is bent, the second backplate 220 is disposed under the display substrate 110 and is spaced apart from the first backplate 210.

Specifically, the second backplate 220 is disposed under the pad portion PAD of the display panel 100.

The second backplate 220 is disposed under the display substrate 110 to supplement the rigidity of the display substrate 110, while maintaining a portion of the display substrate 110 constituting the pad portion PAD in a flat state.

Since the second backplate 220 is formed to have a certain strength and a certain thickness to supplement the rigidity of the display substrate 110, the second backplate 120 may not be formed in a portion of the display panel 100 corresponding to the bent portion BNP.

After the display panel 100 is bent, the second backplate 220 is disposed on a upper surface of the pad portion PAD of the display panel 100, and is disposed between the front portion FP and the pad portion PAD.

In other words, while the display panel 100 is bent, the second backplate 220 is disposed under the front portion FP of the display panel 100, and is disposed on a upper surface of the pad portion PAD of the display panel 100.

The cushion plate 300 can be disposed under the first backplate 210.

The cushion plate 300 can include an adhesive layer having an embossed layer 310, and a metal foam 320. The adhesive layer can be the embossed layer 310. Specifically, the metal foam 320 with a predefined thickness is disposed on one surface of the embossed layer 310.

Figure 2:
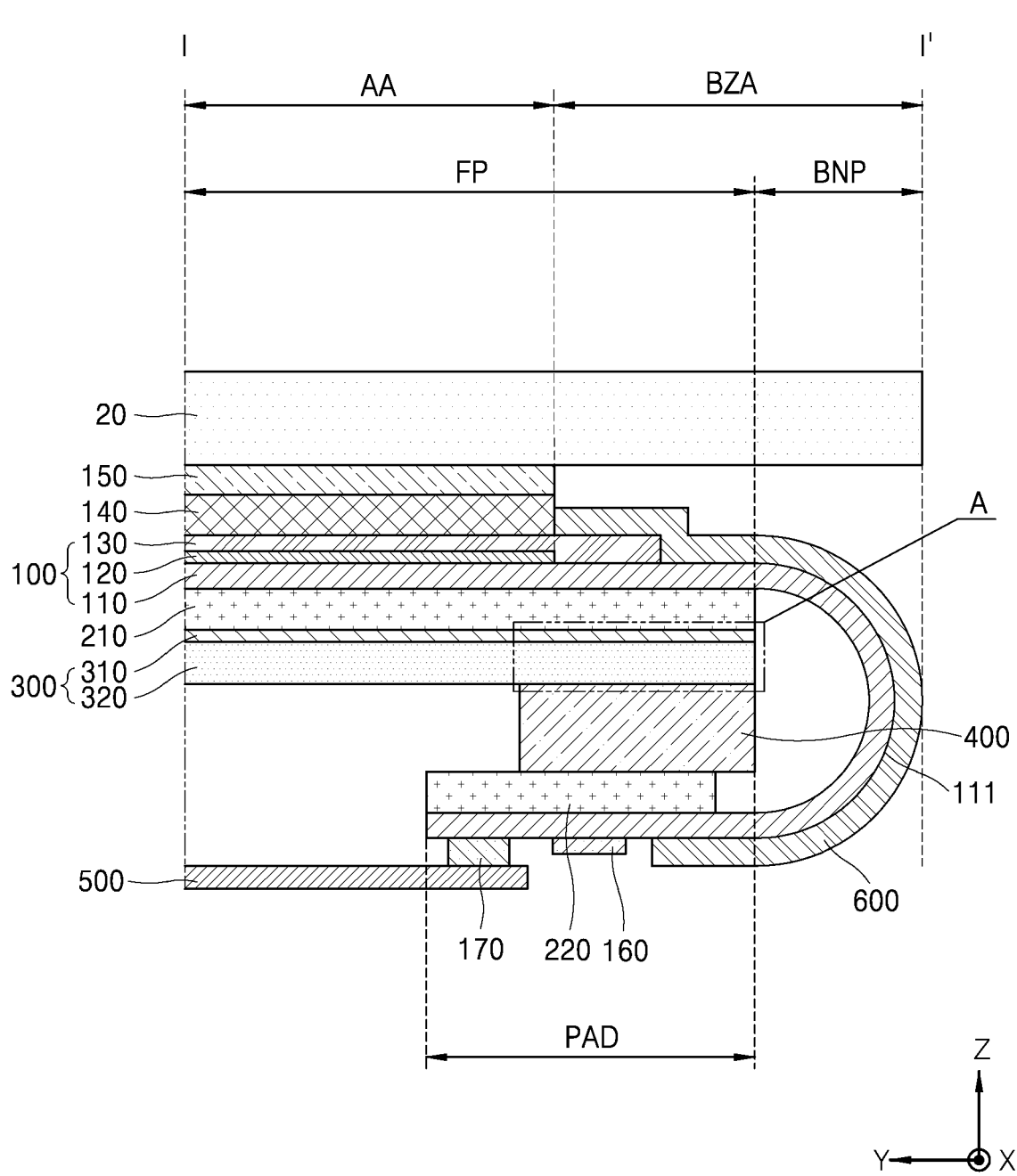
FIG. 2 is a cross-sectional view of a display module according to an embodiment of the present disclosure.

Referring to FIG. 2, based on an arrangement of the display module 10, the metal foam 320 is disposed on a lower surface of the embossed layer 310. In other words, the metal foam 320 is disposed under the embossed layer 310.

Hereinafter, the cushion plate 300 according to a first embodiment of the present disclosure will be described in detail with reference to FIG. 3.

First, the embossed layer 310 can refer to a layer that directly contacts the first backplate 210 to fix or connect the cushion plate 300 to the first backplate 210, and thus can function as an adhesive layer containing an adhesive component. In this case, a surface of the embossed layer 310 can be formed with a plurality of embossed patterns. For example, a surface of the embossed layer 310 contacting the first backplate 210 can include a plurality of embossed patterns. However, the present disclosure is not limited to it. The adhesive layer can include the embossed layer 310. The embossed layer 310 can be formed of or include a material such as OCA (Optical Clear Adhesive), OCR (Optical Clear Resin), or PSA (Pressure Sensitive Adhesive).

Specifically, the embossed layer 310 can include a base substrate 311, and a first adhesive layer 313a and a second adhesive layer 313b disposed on both opposite surfaces of the base substrate 311, respectively.

In this case, the second adhesive layer 313b can contact the metal foam 320 to bond and fix the metal foam 320 to the embossed layer 310.

The first adhesive layer 313a of the embossed layer 310 can have a plurality of embossed patterns 313e such as an uneven structure. That is, an upper surface of the first adhesive layer 313a of the embossed layer 310 can include a plurality of embossed patterns 313e.

The first adhesive layer 313a of the embossed layer 310 can act as a surface in contact with the first backplate 210. The first adhesive layer 313a has the embossed patterns 313e, thereby preventing production of air bubbles between the first backplate 210 and the cushion plate 300, such that a degassing process for removing air bubbles can be omitted.

The base substrate 311 of the embossed layer 310 can serve to hold a shape of the embossed layer 310, and can be formed of a material such as PET.

In order to have an effective anti-bubble effect, the embossed layer 310 preferably has a thickness of at least 40 μm.

The metal foam 320 is disposed on one surface of the embossed layer 310.

The metal foam 320 can refer to a porous metal structure containing metal as a main component, and the metal foam 320 can have a multiple of pores 321 therein.

That is, the metal foam 320 can refer to a porous metal structure having a multiple of pores 321 therein.

The metal foam 320 can be formed using a following manufacturing method by way of example. However, the present disclosure is not limited thereto.

The metal foam 320 can be formed by sintering a metal foam precursor containing metal powders.

The metal foam precursor refers to a structure before proceeding with a process performed to form the metal foam 320 such as the sintering process.

For example, the metal foam precursor can be formed using a slurry containing metal powders, dispersant, and binder.

The metal powder can be embodied as mixture metal powers or alloy powders between at least two or more of copper powder, nickel powder, iron powder, SUS powder, molybdenum powder, silver powder, platinum powder, gold powder, aluminum powder, chromium powder, indium powder, tin powder, magnesium powder, phosphorous powder, zinc powder, and manganese powder. However, the present disclosure is not limited thereto.

In one example, alcohol can be used as the dispersant. However, the present disclosure is not limited thereto.

In this case, the alcohol can include monohydric alcohol having 1 to 20 carbon atoms such as methanol, ethanol, propanol, pentanol, octanol, ethylene glycol, propylene glycol, pentanol, 2-methoxyethanol, 2-ethoxyethanol, 2-butoxyethanol, glycerol, texanol or terpineol, or a dihydric alcohol having 1 to 20 carbon atoms such as ethylene glycol, propylene glycol, hexanediol, octanediol or pentanediol, or polyhydric alcohols other than dihydric alcohol. However, the present disclosure is not limited thereto.

A type of the binder is not particularly limited and can be appropriately selected according to a type of a metal component or the dispersant used in preparation of the slurry.

For example, the binder can include an alkyl cellulose having an alkyl group having 1 to 8 carbon atoms such as methyl cellulose or ethyl cellulose, polyalkylene carbonate having an alkylene unit having 1 to 8 carbon atoms such as polypropylene carbonate or polyethylene carbonate, or a polyvinyl alcohol-based binder such as polyvinyl alcohol or polyvinyl acetate. However, the present disclosure is not limited thereto.

After producing the slurry containing the metal powder, the dispersant, and the binder as described above, the slurry can be injected into a frame having a predefined shape or coating the slurry on the substrate, thereby forming the metal foam precursor.

The metal foam precursor as thus formed can be changed into the metal foam 320 via the sintering process.

In this case, a condition of the sintering process is not particularly limited as long as the process proceeds at a temperature and for a time duration to allow solvent contained in the slurry to be removed at a desired amount.

In one example, the sintering temperature can be in a range of about 50° C. to 250° C. and the sintering time duration can be predefined. However, the present disclosure is not limited thereto.

According to an embodiment of the present disclosure, after forming the metal foam precursor on the embossed layer 310, the sintering process can be performed to form the metal foam 320, thereby forming the cushion plate 300 including the embossed layer 310 and the metal foam 320.

Alternatively, after forming the metal foam 320 separately from the embossed layer 310, the embossed layer 310 and the metal foam 320 can be bonded to each other, thereby forming the cushion plate 300 including the embossed layer 310 and the metal foam 320. Thus, the manufacturing method of the cushion plate 300 is not particularly limited.

Figure 3:
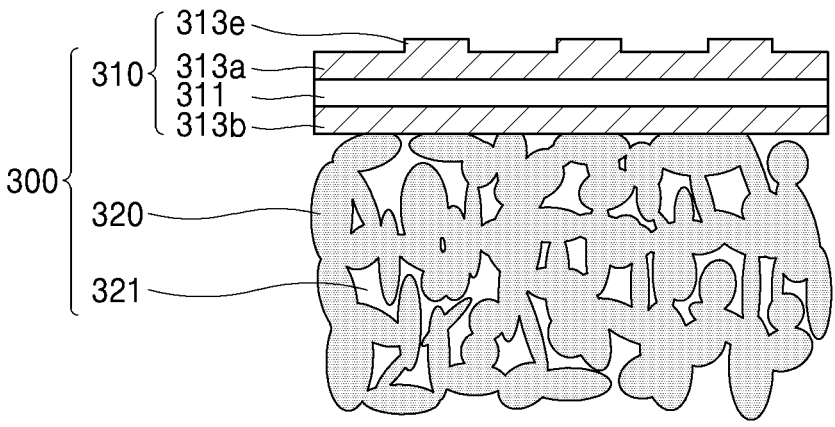
FIG. 3 to FIG. 12 are enlarged cross-sectional views of an area A of FIG. 2, and are enlarged cross-sectional views of cushion plates according to a first embodiment to a tenth embodiment of the present disclosure, respectively.

Using this manufacturing process, the cushion plate 300 according to the first embodiment of the present disclosure can be formed as shown in FIG. 3.

In the cushion plate 300 including the embossed layer 310 and the metal foam 320, the metal foam 320 as a metal structure having a multiple of pores 321 therein can have a heat-dissipation function and a cushion function at the same time.

The metal foam 320 is formed of metal with a high thermal conductivity, such that the metal foam 320 itself exhibits excellent heat-dissipation function. Since the metal foam has the metal structure having a multiple of pores 321 therein, the metal foam can also realize excellent cushioning function.

In particular, because the metal foam 320 has a metal structure having a multiple of pores 321 therein, an overall surface area thereof can increase, and thus, the metal foam 320 itself can realize the excellent heat-dissipation function.

Therefore, the cushion plate 300 according to an embodiment of the present disclosure has both of an effective heat-dissipation function and an effective cushion functions at the same time using only the metal foam 320 without having a heat-dissipation layer for a heat-dissipation function and a cushion layer for a cushion function as separate layers.

Figure 13A:
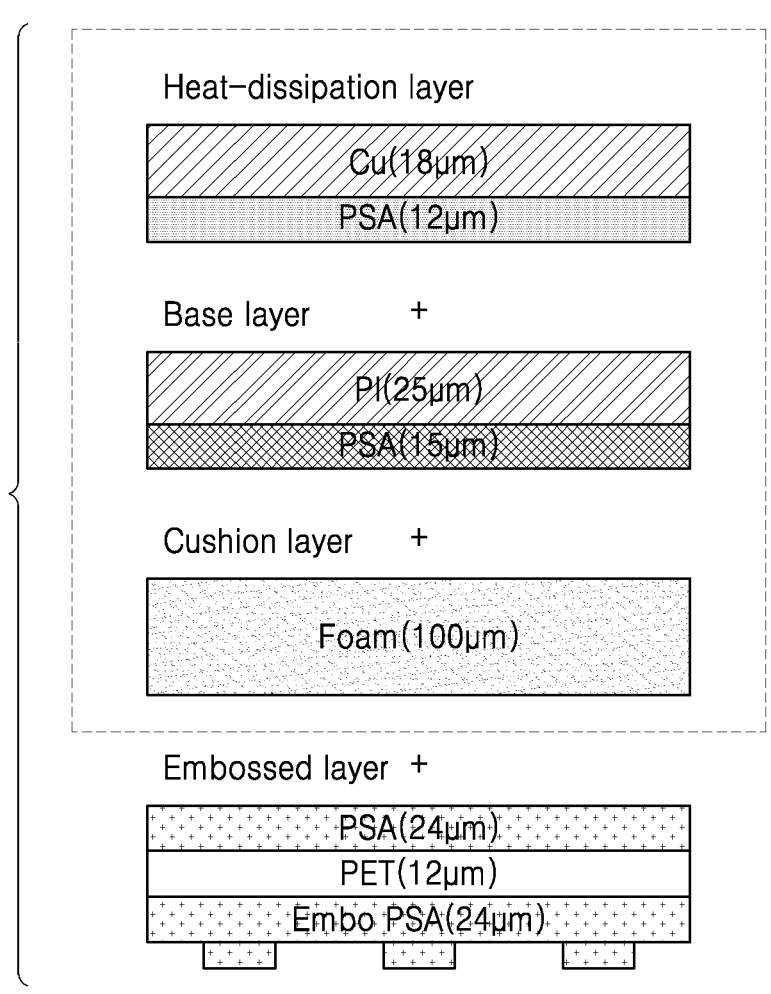
FIG. 13A and FIG. 13B are comparative cross-sectional views of laminated structures of cushion plates according to Comparative Example, and an embodiment of the present disclosure, respectively.
Figure 13B:
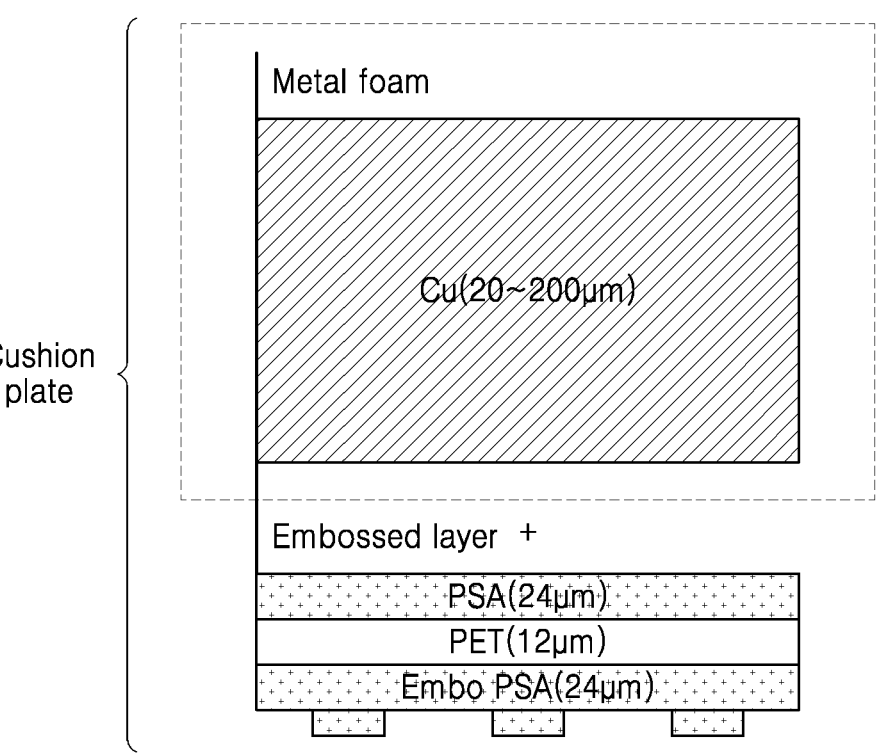

In this regard, referring to FIGS. 13A and 13B, FIG. 13A shows Comparative Example of a cushion plate 300 having a four-layers laminated structure. FIG. 13B shows a cross-sectional view of a cushion plate 300 having a two-layers laminated structure including the metal foam 320 according to an embodiment of the present disclosure.

As shown in FIG. 13A, the cushion plate according to Comparative Example has a structure in which four layers are laminated by sequentially stacking a cushion layer, a base layer, and a heat-dissipation layer on an embossed layer.

The embossed layer can include a base substrate formed of PET, and a first adhesive layer PSA and a second adhesive layer PSA on both opposing surfaces of the base substrate, respectively, wherein the second adhesive layer can be embodied as an embossed adhesive layer Embo PSA.

In this case, the base substrate of the embossed layer can have a thickness of about 12 μm, and each of the first adhesive layer and the second adhesive layer can have a thickness of about 24 μm.

A cushion layer as a foam pad portion can be formed on the embossed layer to impart a cushion function to the cushion plate.

In this case, the cushion layer should have a thickness of at least 100 μm in order to provide minimum effective cushioning function using only the foam pad.

The heat-dissipation layer is formed on the cushion layer, and the base layer must be added between the cushion layer and the heat-dissipation layer.

The heat-dissipation layer is directly bonded to the cushion layer. In this case, when the cushion plate is bent in a bent area of the display module and then a time lapses, the cushion layer and the heat-dissipation layer formed of different materials from each other are not completely adhered to each other, and are separated from each other.

Accordingly, the base layer can be added between the cushion layer and the heat-dissipation layer to minimize the separation between the cushion layer and the heat-dissipation layer and to realize flexibility in the bent area.

The base layer can be formed by disposing an adhesive layer PSA on a flexible base made of polyimide (PI).

In this case, in order for the base layer to achieve minimum effective separation-suppressing and support functions, the base made of the polyimide should have a thickness of at least 25 μm, and a thickness of the adhesive layer PSA included in the base layer should be at least 15 μm.

The heat-dissipation layer is disposed on the base layer to impart a heat-dissipation function to the cushion plate 300.

The heat-dissipation layer can be formed by disposing an adhesive layer PSA on a metal layer formed of a material having good thermal conductivity such as copper.

In this case, in order for the heat-dissipation layer to achieve minimum effective heat-dissipation function, the metal layer must have a thickness of at least 18 μm, and a thickness of the adhesive layer PSA included in the heat-dissipation layer should be at least 12 μm.

In other words, the cushion plate according to Comparative Example can have a structure in which the four layers are laminated, that is, the layers having separate functions must be stacked one on top of another in order to provide both of the heat-dissipation function and the cushion function. Thus, the number of process steps can increase, thus leading to an increase in a manufacturing cost of the device.

In particular, the layers having different functions are formed of different materials. Thus, additional adhesive layers must be disposed between the layers in order to bond the layers to each other. Thus, a total thickness of the cushion plate can be further increased.

To the contrary, as shown in FIG. 13B, the cushion plate 300 according to an embodiment of the present disclosure can achieve both of an effective heat-dissipation function and an effective cushion function only using a double-layer laminated structure in which the metal foam 320 and the embossed layer 310 are stacked one on top of the other.

That is, because the cushion plate 300 according to an embodiment of the present disclosure can realize both the heat-dissipation function and the cushion function using only the metal foam 320, there is no need to stack separate layers formed of different materials having a heat-dissipation function and a cushion function, respectively, so that separation between the layers, and adhesion deterioration therebetween can be minimized.

In addition, there is no need to add a separate adhesive layer configured to fix or connect the layers to each other. Thus, the increase in the manufacturing cost of the device due to the increase in the thickness due to the adhesive layer or the addition of various layers may not occur.

In this case, a thickness of the metal foam 320 can be in a range of 20 μm to 200 μm, and a thickness of the cushion plate 300 can be in a range of 80 μm to 260 μm.

In particular, even when the metal foam 320 of the cushion plate 300 according to an embodiment of the present disclosure has a minimum thickness of 20 μm, the metal foam 320 can have both a heat-dissipation function and a cushion function. Thus, a total thickness of the cushion plate 300 can be reduced.

The minimum and maximum thicknesses of each of the metal foam 320 and the cushion plate 300 can be appropriately selected according to a shape change of the display module 10.

As described above, the cushion plate 300 according to an embodiment of the present disclosure includes the metal foam 320 having a higher freedom in the shape change. Thus, in response to the design change of the display module 10, the shape of the cushion plate 300 can be freely and easily changed.

That is, the metal foam 320 has a very excellent heat-dissipation function and a very excellent cushioning function only at a small thickness, such that a total thickness of the cushion plate 300 can be greatly reduced, and thus the bezel area can be reduced.

Figure 4:
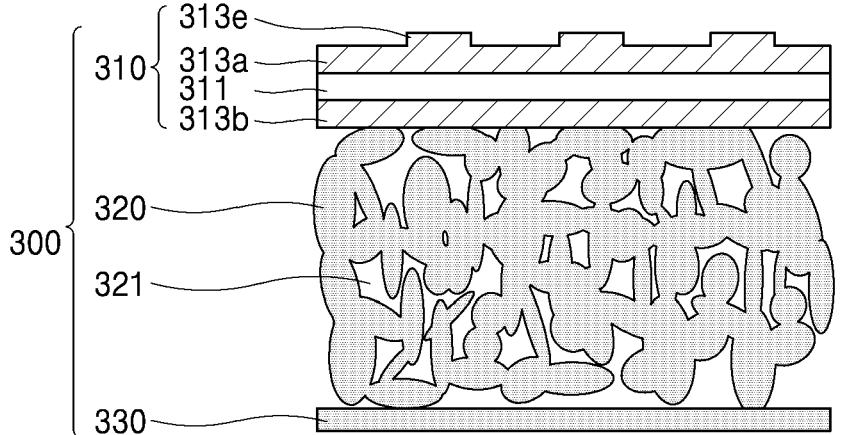

FIG. 4 shows a cushion plate 300 according to a second embodiment of the present disclosure.

In the cushion plate 300 according to the second embodiment, a metal foil 330 can be disposed on a lower surface of the metal foam 320 according to the first embodiment.

In this case, the metal foil 330 can include a metal mixture or an alloy including at least one of copper, nickel, iron, zinc, SUS, molybdenum, silver, platinum, gold, aluminum, chromium, indium, tin, magnesium, phosphorus, zinc, and manganese. However, the present disclosure is not limited thereto.

The metal foam 320 and the metal foil 330 can be formed of the same metal material.

For example, the metal foam 320 can include a copper material, and the metal foil 330 can include a copper material.

When the metal foam 320 and the metal foil 330 are formed of the same metal material, the cushion plate can have higher thermal conductivity, and the interlayer separation can be minimized due to high adhesion.

In one example, as described above, the metal foam 320 has a porous metal structure having a plurality of pores 321 inside the metal foam 320, and thus can have both a heat-dissipation function and a cushion function.

In particular, since the metal foam 320 has the porous structure having a large number of pores 321, the metal foam can have an excellent shock absorption function even though a separate cushion layer is not added.

However, when there are many pores 321 therein, the shock absorbing function can increase, while thermal conductivity and EMI shielding function can slightly decrease in inverse proportion to the increased shock absorbing function.

Therefore, in the second embodiment, when the metal foil 330 is additionally disposed on the lower surface of the metal foam 320, first heat conduction occurs along an entire surface of the metal foil 330 and then, second heat conduction occurs along the metal foam 320, such that more efficient and effective thermal conductivity can be obtained.

Further, adding the metal foil 330 to the lower surface of the metal foam 320, it can allow increasing an area of a metal layer while covering one surface of the porous metal foam 320 with the metal foil 330, further improving the EMI shielding performance.

Figure 5:
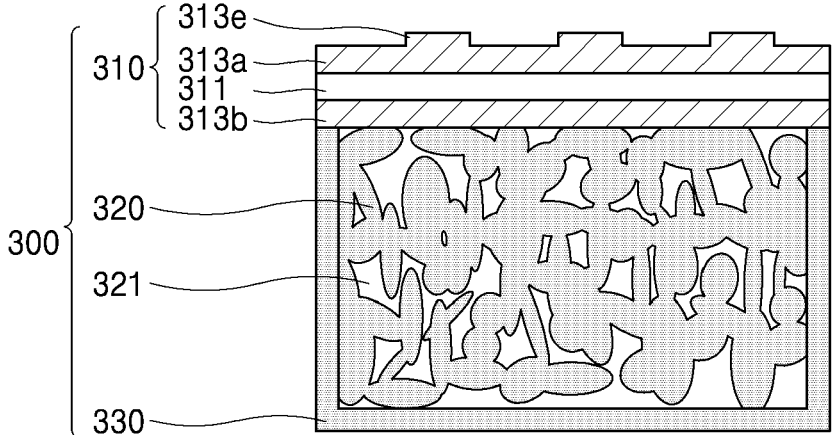

FIG. 5 shows a cushion plate 300 according to a third embodiment of the present disclosure.

In the cushion plate 300 according to the third embodiment, a metal foil 330 can be additionally disposed on a side surface of the metal foam 320 according to the second embodiment.

In other words, in the third embodiment, the metal foil 330 can cover an entirety of an outer surface of the metal foam 320 except for one surface thereof at which the metal foam 320 contacts the embossed layer 310.

As described above, the third embodiment has a structure in which the outer surface of the metal foam 320 is covered with the metal foil 330, a waterproof effect against external moisture can be secured and, further improved thermal conductivity and EMI shielding performance can be obtained.

Figure 6:
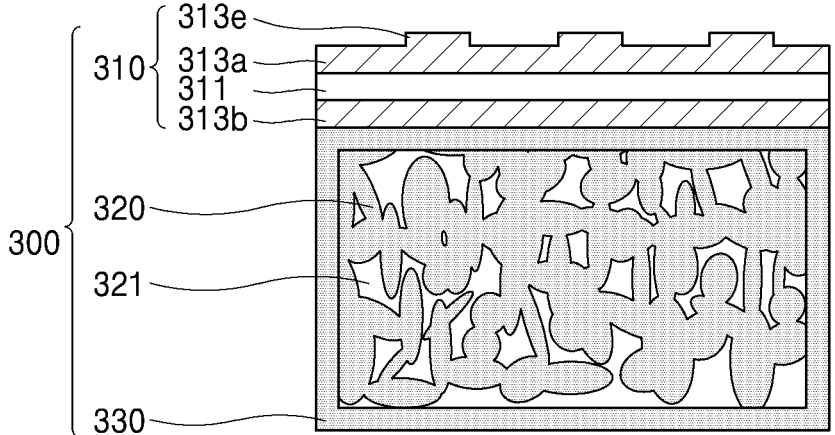

FIG. 6 shows a cushion plate 300 according to a fourth embodiment of the present disclosure.

In the cushion plate 300 according to the fourth embodiment, a metal foil 330 is additionally disposed on an upper surface of the metal foam 320 according to the third embodiment, so that the metal foam 320 can be sealed with the metal foil 330.

In other words, in the fourth embodiment, the metal foil 330 can cover an entirety of the outer surface of the metal foam 320.

Accordingly, the metal foil 330 can be added between the embossed layer 310 and the metal foam 320 to further increase the adhesion.

In addition, in the fourth embodiment, since the metal foam 320 is sealed with the metal foil 330, a waterproof effect against external moisture, and further improved thermal conductivity and EMI shielding performance can be secured.

Figure 7:
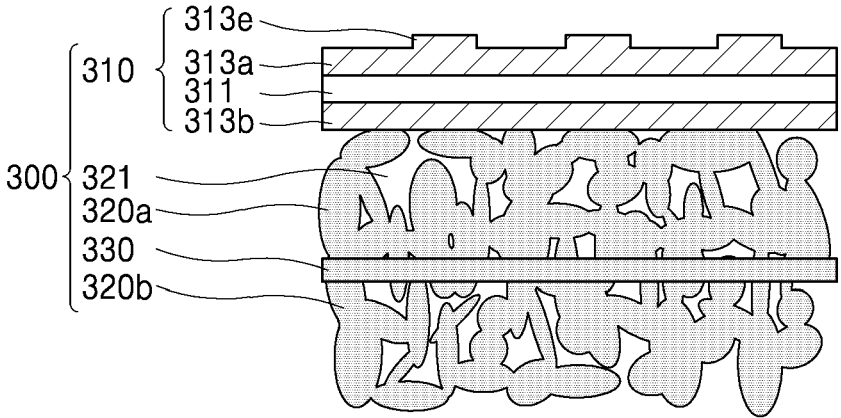

FIG. 7 shows a cushion plate 300 according to a fifth embodiment of the present disclosure.

In the cushion plate 300 according to the fifth embodiment, the metal foam 320 includes a first metal foam layer 320a, a second metal foam layer 320b, and a metal foil 330 disposed between the first metal foam layer 320a and the second metal foam layer 320b.

Specifically, the first metal foam layer 320a can be bonded to the embossed layer 310, and the second metal foam layer 320b can be bonded to the first metal foam layer 320a via the metal foil 330 interposed therebetween.

In the fifth embodiment, the metal foam 320 can be divided into a plurality of metal foam layers, and each metal foil 330 can be additionally disposed between adjacent layers of the plurality of metal foam layers, thereby further improving thermal conductivity and EMI shielding performance.

Figure 8:
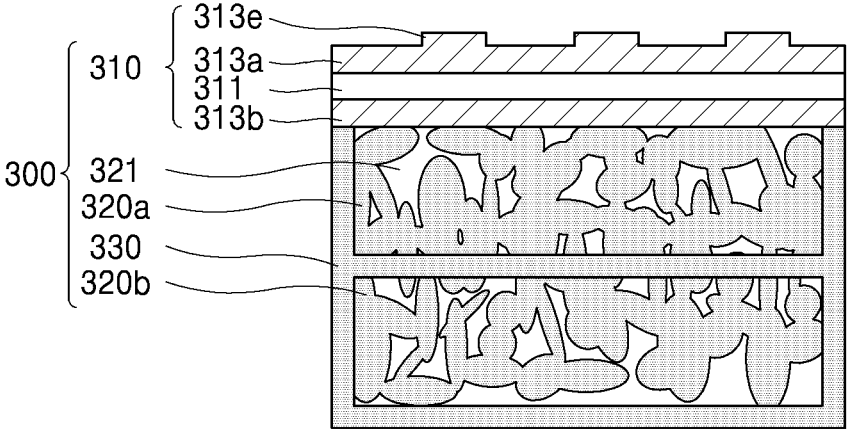

FIG. 8 shows a cushion plate 300 according to a sixth embodiment of the present disclosure.

In the cushion plate 300 according to the sixth embodiment, a metal foil 330 is additionally disposed on each of lower and side surfaces of the metal foam 320 according to the fifth embodiment, so that the second metal foam layer 320b can be sealed with the metal foil 330.

Specifically, the first metal foam layer 320a can be bonded to the embossed layer 310, and the second metal foam layer 320b can be bonded to the first metal foam layer 320a via the metal foil 330 interposed therebetween.

Further, covering the side surfaces of the first metal foam layer 320a and the second metal foam layer 320b and the lower surface of the second metal foam layer 320b with metal foil 330 can allow the second metal foam layer 320b to be sealed with the metal foil 330.

That is, in the sixth embodiment, the metal foam 320 can be divided into a plurality of metal foam layers, and each metal foil 330 can be additionally disposed between adjacent layers of the plurality of metal foam layers, and some of the metal foam layers can be sealed with the metal foil 330, thereby securing a waterproof effect against external moisture, and further improved thermal conductivity and EMI shielding performance.

Figure 9:
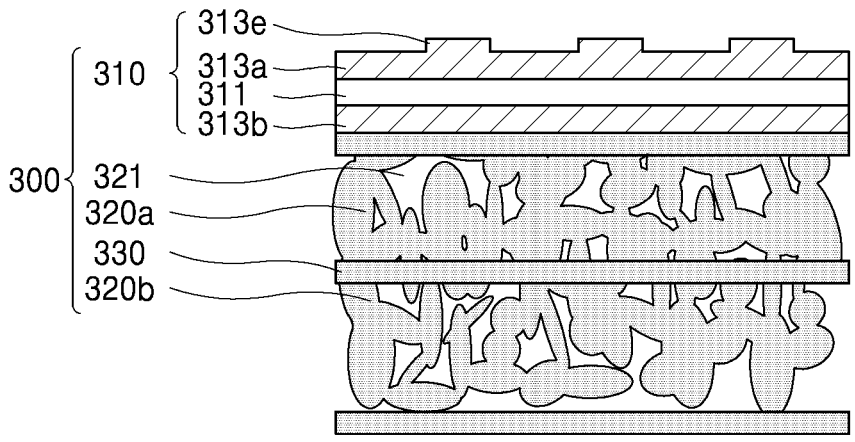

FIG. 9 shows a cushion plate 300 according to a seventh embodiment of the present disclosure.

In the cushion plate 300 according to the seventh embodiment, a metal foil 330 can be additionally disposed on the upper surface and the lower surface of the metal foam 320 according to the fifth embodiment.

Specifically, the first metal foam layer 320a can be bonded to the embossed layer 310 via a first metal foil 330 interposed therebetween, and the second metal foam layer 320b can be bonded to the first metal foam layer 320a via a second metal foil 330 interposed therebetween.

Further, an outer surface of the second metal foam layer 320b can be covered with the metal foil 330.

That is, in the seventh embodiment, the metal foam 320 can be divided into a plurality of metal foam layers, and each metal foil 330 can be additionally disposed between adjacent layers of the plurality of metal foam layers, and each of the metal foils 330 can be disposed to each of surfaces of the metal foam layers, thereby securing further improved thermal conductivity and EMI shielding performance.

Figure 10:
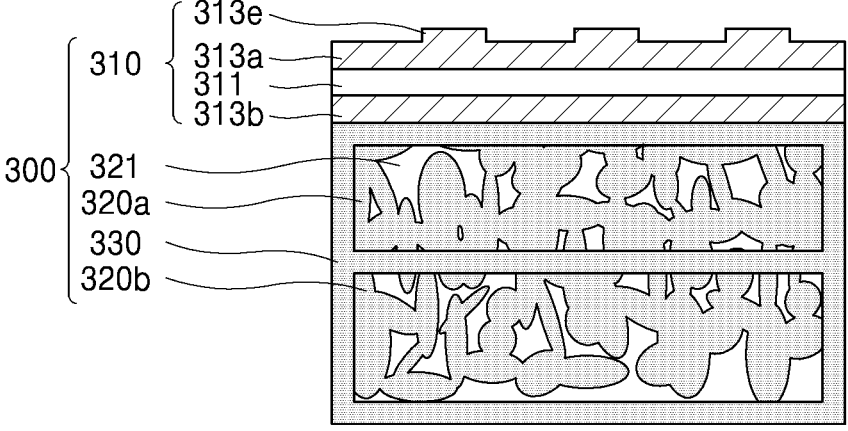

FIG. 10 shows a cushion plate 300 according to an eighth embodiment of the present disclosure.

In the cushion plate 300 according to the eighth embodiment, a metal foil 330 is additionally disposed on a side surface of the metal foam 320 according to the seventh embodiment, so that the first metal foam layer 320a and the second metal foam layer 320b can be sealed with the metal foil 330.

Specifically, the first metal foam layer 320a can be bonded to the embossed layer 310 via the first metal foil 330 interposed therebetween, and the second metal foam layer 320b can be bonded to the first metal foam layer 320a via the second metal foil 330 interposed therebetween.

Further, covering the upper surface of the first metal foam layer 320a, the side surfaces of the first metal foam layer 320a and the second metal foam layer 320b, and the lower surface of the second metal foam layer 320b with the metal foil 330, the first metal foam layer 320a and the second metal foam layer 320b can be sealed with the metal foil 330.

That is, in the eighth embodiment, the metal foam 320 can be divided into a plurality of metal foam layers, and each metal foil 330 can be additionally disposed between adjacent layers of the plurality of metal foam layers, and the metal foam layers can be sealed with the metal foil 330, thereby securing the waterproof effect against moisture, and further improved thermal conductivity and EMI shielding performance.

Figure 11:
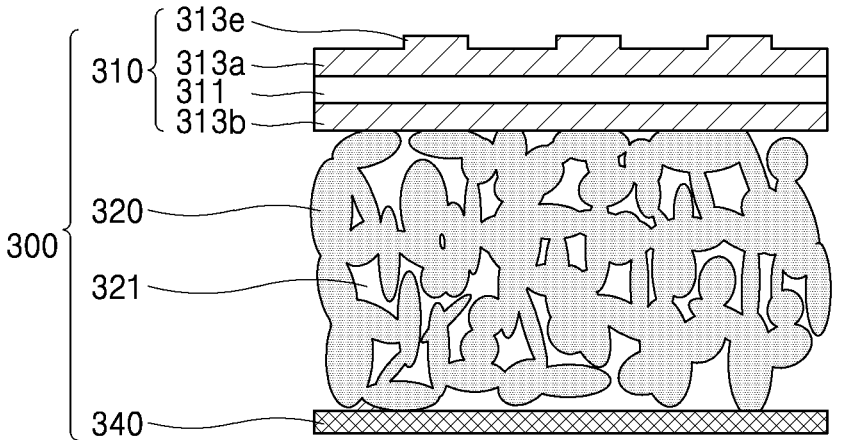

FIG. 11 shows a cushion plate 300 according to a ninth embodiment of the present disclosure.

In the cushion plate 300 according to the ninth embodiment, a metal paste 340 can be applied to a lower surface of the metal foam 320 according to the first embodiment.

In one example, the metal paste 340 can contain metal particles, solvent, binder, and surfactant.

In this case, the metal paste 340 can include metal particles formed of a metal mixture or an alloy including at least one of copper, nickel, iron, zinc, SUS, molybdenum, silver, platinum, gold, aluminum, chromium, indium, tin, magnesium, phosphorus, zinc, and manganese. However, the present disclosure is not limited thereto.

Materials used for the solvent, the binder, and the surfactants are not particularly limited and can be those as commonly used in the art.

The metal paste 340 containing these materials can be applied to the lower surface of the metal foam 320 to form a metal paste layer on the lower surface of the metal foam 320.

Further, the metal paste 340 applied in this way can be additionally heat-treated to remove the solvent therefrom.

As described above, in the ninth embodiment, the metal paste 340 can be applied on the lower surface of the metal foam 320, such that further improved thermal conductivity and EMI shielding performance can be obtained.

Figure 12:
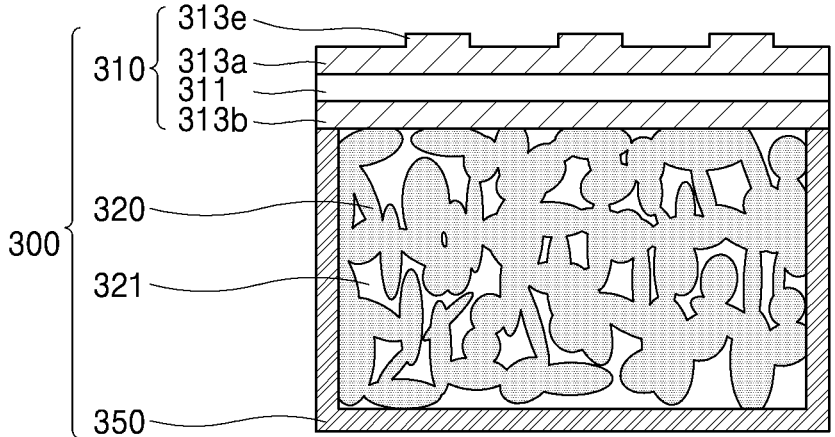

FIG. 12 shows a cushion plate 300 according to a tenth embodiment of the present disclosure.

In the cushion plate 300 according to the tenth embodiment, heat-dissipation ink (or heat-dissipation ink layer) 350 can be applied to the lower and side surfaces of the metal foam 320 according to a first embodiment of the present disclosure.

The heat-dissipation ink 350 can contain a highly conductive material, for example, a carbon material or a metal filler.

In this case, the carbon material can include graphite, carbon nanofiber, or carbon nanotube. The metal filler can include metal powders having excellent thermal conductivity which can be formed of a metal mixture or an alloy including at least one of copper, nickel, iron, zinc, SUS, molybdenum, silver, platinum, gold, aluminum, chromium, indium, tin, magnesium, phosphorus, zinc, and manganese. However, the present disclosure is not limited thereto.

However, the heat-dissipation ink 350 is not limited thereto. A material in the heat-dissipation ink 350 is not particularly limited and can be a material that can be typically used in this technical field.

Applying the heat-dissipation ink 350 on the lower and side surfaces of the metal foam 320 can allow the lower and side surfaces of the metal foam 320 to be covered with a heat-dissipation member in an easier manner.

As described above, in the tenth embodiment, further improved thermal conductivity and EMI shielding performance can be obtained by covering the lower surface and the side surface of the metal foam 320 with the heat-dissipation ink.

The first connection member 400 is disposed under the cushion plate 300.

When bending the pad portion PAD of the display panel 100 from the bent portion BNP so that the pad portion PAD of the display panel 100 is disposed under the lower surface of the front portion FP of the display panel 100, a restoring force to restore the display panel 100 to a state before the display panel 100 is bent can be applied to the display panel 100.

When the restoring force acts strongly, the pad portion PAD of the bent display panel 100 may not be fixedly maintained but can be lifted.

The first connection member 400 is disposed between the front portion FP of the display panel 100 and the pad portion PAD thereof to fix or connect the bent display panel 100 such that the panel is maintained at the bent state.

The first connection member 400 is formed to have a certain thickness in a thickness direction of the bent portion. The first connection member 400 can be embodied as a double-sided tape with strong adhesive strength that can secure bonding between the front portion FP of the display panel 100 and the pad portion PAD thereof.

Further, the first connection member 400 can be embodied as a foam tape, or a foam pad, and can function as a shock absorber.

Further, the first connection member 400 can be embodied as a double-sided conductive tape having conductivity.

For example, the double-sided conductive tape can include a conductive layer between an upper adhesive layer and a lower adhesive layer, and the adhesive layer can include a conductive material.

In one example, a driving integrated circuit 160 can be disposed on an opposite surface of the pad portion PAD of the display panel 100 to one surface thereof on which the second backplate 220 is disposed.

In an embodiment according to the present disclosure, it is assumed that the driving integrated circuit 160 is embodied as COP (Chip On Plastic) mounted on the display substrate 110. However, the present disclosure is not limited thereto.

The driving integrated circuit 160 can be mounted on the display substrate 110 using a chip bonding process or a surface mounting process. In the bent state, the driving integrated circuit 160 can be disposed on a lower surface of the display substrate 110. That is, the driving integrated circuit 160 can be disposed on the lower surface of the pad portion PAD.

The driving integrated circuit 160 generates a data signal and a gate control signal based on image data and a timing synchronization signal supplied from an external host driving system. In addition, the driving integrated circuit 160 can supply the data signal to a data line of each pixel through the display pad, and can supply the gate control signal to a gate driving circuitry through the display pad.

That is, the driving integrated circuit 160 can be mounted on a chip mounting area defined on the display substrate 110 and can be electrically connected to the display pad, and can be connected to a signal line of each of the gate driving circuitry and the pixel array 120 disposed on the display substrate 110.

Since the driving integrated circuit 160 generates a considerable amount of heat, it is desirable to effectively impart a heat-dissipation effect to the driving integrated circuit 160.

Therefore, the driving integrated circuit 160 can be effectively heat-dissipated by the cushion plate 300 according to the embodiment of the present disclosure as described above.

The display pad can define a distal end of the display substrate 110 on which the driving integrated circuit 160 is mounted.

The display pad can be electrically connected to a flexible circuit board 500 on which a circuit board is mounted under the lower surface of the display substrate.

The flexible circuit board 500 can be electrically connected to the display pad defining the distal end of the display substrate 110 via a conductive adhesive layer 170 using a film attaching process, and can be disposed under the lower surface of the display panel 100.

In this case, the conductive adhesive layer 170 can be embodied as an ACF (Anisotropic Conductive Film) in one example.

The circuit board can provide the image data and the timing synchronization signal supplied from the host driving system to the driving integrated circuit 160, and can provide voltages for driving the pixel array 120, the gate driving circuitry, and the driving integrated circuit 160 thereto, respectively.

In one example, a bent portion reinforcing member 600 can be disposed on an outer surface 111 of the bent portion BNP of the display panel 100. The bent portion reinforcing member 600 can extend to cover the bent portion BNP, and cover at least a partial area of the front portion FP and at least a partial area of the pad portion PAD.

The bent portion reinforcing member 600 can include resin which can be embodied as an ultraviolet (UV) curable acrylic resin. However, the present disclosure is not limited thereto.

Specifically, the bent portion reinforcing member 600 can be formed of a cured product of a resin resulting from a curing process after coating the resin. When the resin includes an ultraviolet curable resin, the curing can be performed using UV.

The bent portion reinforcing member 600 can be disposed on the outer surface 111 of the display panel 100 to cover various signal lines between the encapsulation portion 130 of the display panel 100 and the display pad. Accordingly, the bent portion reinforcing member 600 can prevent moisture invasion into the signal line while protecting the signal line from external impact.

Further, since the bent portion reinforcing member 600 is disposed on the outer surface 111 of the bent portion BNP, the rigidity of the display panel 100 in the bent portion BNP from which the backplate has been removed can be supplemented.

The display module according to a first embodiment of the present disclosure described as described above can include a display panel including a front portion, a bent portion, and a pad portion extending from the bent portion and disposed under the front portion; a cushion plate can dispose between the front portion and the pad portion; and a first connection member configured to connect the pad portion to the display panel.

In this case, the cushion plate can include an adhesive layer having an embossed layer and a metal foam, wherein the metal foam can be disposed under the embossed layer.

The embossed layer can include a base substrate and a first adhesive layer and a second adhesive layer respectively disposed on both opposing surfaces of the base substrate, the first adhesive layer can have an embossed pattern, and the second adhesive layer can be bonded to the metal foam.

The metal foam can have a porous metal structure with a large number of pores therein.

In a second embodiment, a metal foil can be disposed on a lower surface of the metal foam.

In a third embodiment, a metal foil can be additionally disposed on a side surface of the metal foam of the second embodiment.

In a fourth embodiment, a metal foil can be additionally disposed on a upper surface of the metal foam of the third embodiment, so that the metal foam is sealed with the metal foil.

In a fifth embodiment, the metal foam can include a first metal foam layer, a second metal foam layer, and a metal foil can dispose between the first metal foam layer and the second metal foam layer.

In a sixth embodiment, a metal foil can be additionally disposed on the lower and side surfaces of the metal foam according to the fifth embodiment, so that the second metal foam layer is sealed with the metal foil.

In a seventh embodiment, a metal foil can be additionally disposed on the upper surface and the lower surface of the metal foam according to a fifth embodiment of the present disclosure.

In an eighth embodiment, a metal foil can be additionally disposed on the side surface of the metal foam according to the seventh embodiment, so that the first metal foam layer and the second metal foam layer are sealed with the metal foil.

In a ninth embodiment, a metal paste can be applied on the lower surface of the metal foam.

In a tenth embodiment, heat-dissipation ink can be applied to the lower and side surfaces of the metal foam.

A thickness of the metal foam can be in a range of 20 μm to 200 μm, and a thickness of the cushion plate is in a range of 80 μm to 260 μm.

A driving integrated circuit can be disposed on a lower surface of the pad portion.

A display device according to an embodiment of the present disclosure can include a cover member, the display module according to an embodiment of the present disclosure coupled to the cover member, and a frame disposed under the display module to support the cover member.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The invention claimed is:

1. A display module, comprising:
a display panel including a front portion, a bent portion, and a pad portion extending from the bent portion of the display panel, the pad portion of the display panel disposed under a lower surface of the front portion of the display panel;
a cushion plate disposed under the display panel and between the front portion and the pad portion; and
a bent panel fixing member configured to fix the pad portion to the cushion plate,
wherein the cushion plate includes a first adhesive layer, a base substrate, a second adhesive layer, a metal foam, and a metal foil in a sequential layer stack,
wherein the metal foam of the cushion plate is disposed under the adhesive layer of the cushion plate,
wherein the metal foam of the cushion plate has a porous metal structure having a plurality of pores, and
wherein the metal foil is disposed on a lower surface and on a side surface of the metal foam of the cushion plate to cover an entirety of an outer surface of the metal foam of the cushion plate and the second adhesive layer is directly disposed on a top surface of the metal foam.

2. The display module of claim 1, wherein the adhesive layer includes an embossed layer having a base substrate, a first adhesive layer, and a second adhesive layer,
the first adhesive layer and the second adhesive layer of the embossed layer respectively disposed on opposing surfaces of the base substrate of the embossed layer,
wherein the first adhesive layer of the embossed layer has an embossed pattern,
wherein the second adhesive layer of the embossed layer is coupled to the metal foam of the cushion plate.

3. The display module of claim 1, wherein the metal foil is additionally disposed on an upper surface of the metal foam of the cushion plate, and the metal foam is sealed with the metal foil.

4. The display module of claim 1, wherein the metal foam of the cushion plate includes:
a first metal foam layer;
a second metal foam layer; and
the metal foil additionally disposed between the first metal foam layer and the second metal foam layer.

5. The display module of claim 4, wherein the second metal foam layer is sealed with the metal foil.

6. The display module of claim 4, wherein the metal foil is additionally disposed on an upper surface of the metal foam.

7. The display module of claim 6, wherein the first metal foam layer and the second metal foam layer of the metal foam are sealed with the metal foil.

8. The display module of claim 1, wherein an Ag paste is disposed under a lower surface of the metal foam of the cushion plate.

9. The display module of claim 1, wherein a heat-dissipation ink layer is disposed on a lower surface and a side surface of the metal foam of the cushion plate.

10. The display module of claim 1, wherein a thickness of the metal foam of the cushion plate is in a range of 20 μm to 200 μm.

11. The display module of claim 1, wherein a thickness of the cushion plate is in a range of 80 μm to 260 μm.

12. The display module of claim 1, further comprising:
a driving integrated circuit disposed under the pad portion of the display panel.

13. The display module of claim 1, further comprising:
a first connection member configured to connect the pad portion to the cushion plate.

14. A display device, comprising:
a cover member;
a display module coupled to the cover member; and
a frame disposed under the display module configured to support the cover member,
wherein the display module includes:
a display panel including a front portion, a bent portion, and a pad portion extending from the bent portion and disposed under the front portion;
a cushion plate including a metal foam, an adhesive layer, and a metal foil, wherein the adhesive layer includes a plurality of embossed patterns being a plurality of protrusions at an upper surface of the adhesive layer; and
a bent panel fixing member configured to fix a portion of the display panel to the cushion plate,
wherein the cushion plate is disposed between the front portion and the pad portion,
wherein the metal foam of the cushion plate has a porous metal structure having a plurality of pores,
wherein the metal foil disposed on a lower surface and on a side surface of the metal foam of the cushion plate to cover an entirety of an outer surface of the metal foam of the cushion plate, and
wherein the adhesive layer of the cushion plate is disposed on an upper surface of the metal foam.

* * * * *